United States Patent
Nakaji et al.

(10) Patent No.: US 8,399,945 B2
(45) Date of Patent: Mar. 19, 2013

(54) SEMICONDUCTOR LIGHT RECEIVING ELEMENT

(75) Inventors: Masaharu Nakaji, Tokyo (JP); Ryota Takemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 387 days.

(21) Appl. No.: 12/783,586

(22) Filed: May 20, 2010

(65) Prior Publication Data

US 2011/0073973 A1    Mar. 31, 2011

(30) Foreign Application Priority Data

Sep. 25, 2009   (JP) ................. 2009-220018

(51) Int. Cl.
*H01L 31/0232*    (2006.01)
(52) U.S. Cl. ............. 257/432; 257/434; 257/E31.002
(58) Field of Classification Search .......... 257/431–436, 257/E31.001, E31.116, E31.002
See application file for complete search history.

(56) References Cited

U.S. PATENT DOCUMENTS

| | | | | |
|---|---|---|---|---|
| 7,928,472 | B2 * | 4/2011 | Ishimura et al. | 257/186 |
| 2005/0230706 | A1 * | 10/2005 | Yagyu et al. | 257/186 |
| 2007/0297484 | A1 | 12/2007 | Mochizuki | |
| 2008/0121867 | A1 | 5/2008 | Yagyu et al. | |

FOREIGN PATENT DOCUMENTS

| | | |
|---|---|---|
| CN | 101098067 A | 1/2008 |
| CN | 101232057 A | 7/2008 |
| JP | 5-304279 | 11/1993 |
| WO | WO 2006/106170 A1 | 10/2006 |

OTHER PUBLICATIONS

R. Takemura et al., 31a-A-7 The development o 25 Gbps pin-PD for 100 Gbps Ethernet: from Extended Abstracts (the 56th Spring Meeting, 2009), *The Japan Society of Applied Physics and Related Societies*, No. 3, p. 1191.
State Intellectual Property Office of the People's Republic of China, First Official Action in Chinese Patent Application No. 100035 (Jun. 20, 2012).

* cited by examiner

*Primary Examiner* — N Drew Richards
*Assistant Examiner* — Yu-Hsi D Sun
(74) *Attorney, Agent, or Firm* — Leydig, Voit & Mayer, Ltd.

(57) ABSTRACT

A semiconductor light detecting element includes: a semiconductor substrate; and a distributed Bragg reflector layer of a first conductivity type, an optical absorption layer, and a semiconductor layer of a second conductivity type, sequentially laminated on the semiconductor substrate. The distributed Bragg reflector layer includes first and second alternately laminated semiconductor layers with different bandgap wavelengths, sandwiching the wavelength of detected incident light. The sum of thicknesses a first and a second semiconductor layer is approximately one-half the wavelength of the incident light detected.

6 Claims, 8 Drawing Sheets

SEMICONDUCTOR LIGHT RECEIVING ELEMENT

BACKGROUND OF THE INVENTION

1. Field of the Invention

The present invention relates to a semiconductor light receiving element including a distributed Bragg reflector layer, and in particular to a semiconduct or light receiving element having a high light-receiving sensitivity to incident light in the vicinity of the 1.3 mm band.

2. Background Art

A photodiode having a distributed Bragg reflector (DBR) layer between an optical absorption layer and a semiconductor substrate has been proposed. Light that has not been absorbed in and has passed through the optical absorption layer is reflected by the DBR layer and absorbed again in the optical absorption layer. Thereby, high quantum efficiency can be obtained in the photodiode having the DBR layer.

SUMMARY OF THE INVENTION

In a DBR layer having a plurality of pairs wherein InGaAsP layers and InP layers are alternately laminated, the reflectance R when the band-gap wavelength of the InGaAsP layers is made to be 1.2 μm was obtained by calculation. In order to suppress the reflection from layers other than the DBR layers, AR coating was carried out on the surface of a device. The calculation was carried out referring to Chapter 1 of "Principles of Optics 1", written by Max Born and Emil Wolf, issued by Tokai University Press.

As a result of calculation, it was found that the number of pairs of InGaAsP layers and InP layers is required to be 17 or more, and the total layer thickness of DBR layers is required to be 3.3 μm or more in order to obtain, for example, 70% or more reflectance. Therefore, problems wherein the uniform control of the thickness and the material composition of the DBR layers on the wafer surface is difficult, the obtaining of reflectance as designed is difficult, and reproducibility is poor, were caused.

To realize high reflectance with a small number of pairs, a method for increasing difference in refractive indices of materials used in the multilayer reflective film layer has been generally known. For example, there has been proposed a DBR layer using InP as the material having a low refractive index, and InGaAsP (band-gap wavelength: 1615 nm) having the As-P composition ratio of 9:1 as the material having a high refractive index (e.g., refer to Japanese Patent Laid-Open No. 05-304279). For the DBR layer, when a material composition wherein difference in refractive indices becomes largest was selected, the reflectance for incident light in the vicinity of the 1.3 μm band was calculated. Although reflectance was sharply elevated with up to about 10 pairs, the reflectance was saturated at around 15 pairs, and 40% or higher reflectance could not be obtained. Consequently, the light-receiving sensitivity to incident light in the vicinity of the 1.3 μm band was low.

In view of the above-described problems, an object of the present invention is to provide a semiconductor light receiving element having a high light-receiving sensitivity to incident light in the vicinity of the 1.3 mm band.

According to the present invention, a semiconductor light receiving element comprises: a semiconductor substrate; and a distributed Bragg reflector layer of a first conductivity type, an optical absorption layer, and a semiconductor layer of a second conductivity type which are sequentially laminated on the semiconductor substrate, wherein the distributed Bragg reflector layer includes first semiconductor layers and second semiconductor layers which are alternately laminated, each first semiconductor layer has a band-gap wavelength which is larger than a wavelength of an incident light, each second semiconductor layer has a band-gap wavelength which is smaller than the wavelength of the incident light, a reflectance peak wavelength of the distributed Bragg reflector layer is 1.20 μm to 1.35 μm, a sum of an optical layer thickness of one of the first semiconductor layers and an optical layer thickness of one of the second semiconductor layers is approximately half of the wavelength of the incident light, and the band-gap wavelength of each first semiconductor layer is 1.30 μm to 1.55 μm.

The present invention makes it possible to provide a semiconductor light receiving element having a high light-receiving sensitivity to incident light in the vicinity of the 1.3 mm band.

Other and further objects, features and advantages of the invention will appear more fully from the following description.

DETAILED DESCRIPTION OF THE PREFERRED EMBODIMENTS

Hereafter, the embodiments of the present invention will be described referring to the drawings. The like components are denoted by the same reference numerals, and the descriptions thereof will be omitted.

First Embodiment

Figure 1:
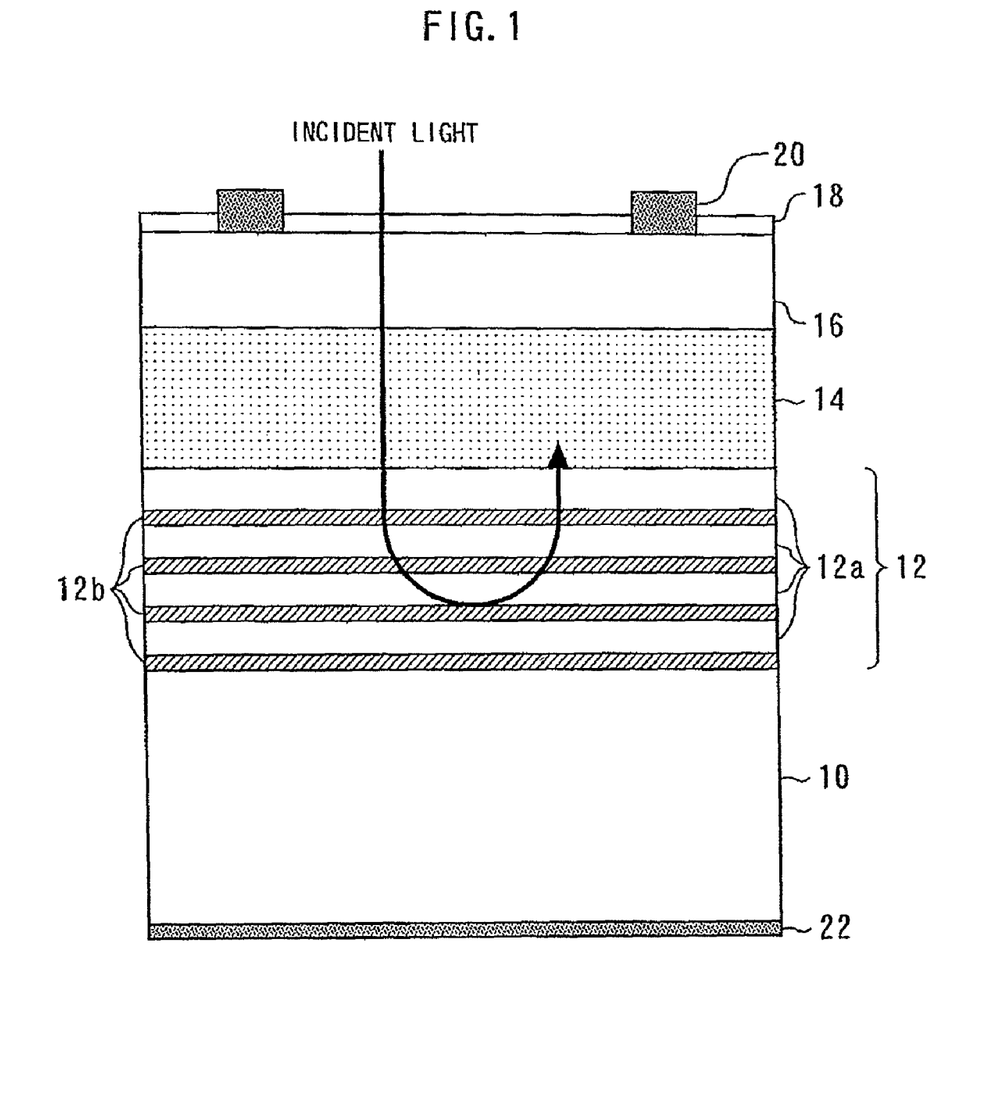
FIG. 1 is a sectional view showing a semiconductor light receiving element according to a first embodiment.

FIG. 1 is a sectional view showing a semiconductor light receiving element according to a first embodiment. The semiconductor light receiving element is a photodiode having DBR layers.

On an n-type InP substrate 10 (semiconductor substrate), an n-type DBR layer 12 (DBR layer of first conductivity type), an i-InGaAs optical absorption layer 14 having a low carrier concentration (optical absorption layer), and a p-type InP window layer 16 (semiconductor layer of second conductivity type) are sequentially formed. On the p-type InP window layer 16, an insulating film 18 composed of SiN or the like also functioning as both a reflection preventing film and a surface protecting film, and an anode (p-type electrode) 20, are formed. On the back side of the n-type InP substrate 10, a cathode (n-type electrode) 22 is formed.

The n-type DBR layer 12 is formed by alternately laminating 15 pairs of n-type InP layers 12a (second semiconductor layers) having a low refractive index and n-type InGaAsP layers 12b (first semiconductor layers) having a high refractive index. The band-gap wavelength of the n-type InP layers 12a is smaller than the wavelength λ, of the incident light. On the other hand, the band-gap wavelength of the n-type InGaAsP layers 12b is larger than the wavelength λ of the incident light.

The wavelength λ of the incident light is in the vicinity of the 1.3 μm band. The reflectance peak wavelength of the n-type DBR layer 12 is 1.20 μm to 1.35 μm. The band-gap wavelength of the n-type InGaAsP layer 12b is 1.30 μm to 1.55 μm.

The thickness of the i-InGaAs optical absorption layer 14 is 1 μm. The optical layer thickness of one of the n-type InP layers 12a and the optical layer thickness of one of the n-type InGaAsP layers 12b is about ¼ the wavelength λ of the incident light, respectively. For example, when λ is 1.30 μm, if the refractive index of InP is 3.2, the thickness of the n-type InP layer 12a is 0.099 μm, and if the refractive index of InGaAsP is 3.38, the thickness of the n-type InGaAsP layer 12b is 0.094 μm.

However, the present invention is not limited to the above values, but the sum (d1×n1+d2×n2) of the optical layer thickness of one of the n-type InP layers 12a (layer thickness: d1, refractive index: n1) (=layer thickness×refractive index) and the optical layer thickness of one of the n-type InGaAsP layers 12b (layer thickness: d2, refractive index: n2) can be approximately half of wavelength λ of the incident light (=λ/2), that is, approximately half of the wavelength at the reflectance peak. According to the present embodiment, the sum becomes 0.60 μm to 0.675 μm. Thereby, the n-type DBR layer 12 operates as a reflection layer for the incident light at high efficiency.

The operation of the semiconductor light receiving element according to the present embodiment will be described. A reverse bias of 0.5 to 3 V is applied so that the potential of the anode 20 becomes lower than the potential of the cathode 22. The incident light is introduced from the upper side of the drawing into the i-InGaAs optical absorption layer 14 through the insulating film 18 and the p-type InP window layer 16. Then, the incident light is absorbed in the i-InGaAs optical absorption layer 14.

When the thickness of the i-InGaAs optical absorption layer 14 is t, and the absorption coefficient of the i-InGaAs optical absorption layer 14 to the incident light is a, the proportion of the incident light absorbed in the i-InGaAs optical absorption layer 14 (=quantum efficiency) is represented by the following equation (1):

$$1-\exp(-\alpha \cdot t) \quad (1)$$

The light that has not been absorbed in and has passed through the i-InGaAs optical absorption layer 14 is reflected by the n-type DBR layer 12, and is absorbed again in the i-InGaAs optical absorption layer 14. When the reflectance of the light by the n-type DBR layer 12 is R, the quantum efficiency when the return light by the n-type DBR layer 12 is considered is represented by the following equation (2):

$$1-\exp(-\alpha \cdot t)+R \cdot \exp(-\alpha \cdot t) \cdot (1-\exp(-\alpha \cdot t)) \quad (2)$$

The difference between Equation (1) and Equation (2) is the increment of the quantum efficiency by the n-type DBR layer 12. The i-InGaAs optical absorption layer 14 is depleted by the reverse bias. The depletion layer is subjected to an electric field, and the electrons and holes flow to the sides of the cathode 22 and the anode 20, respectively, and are taken out as electric currents.

Figure 2:
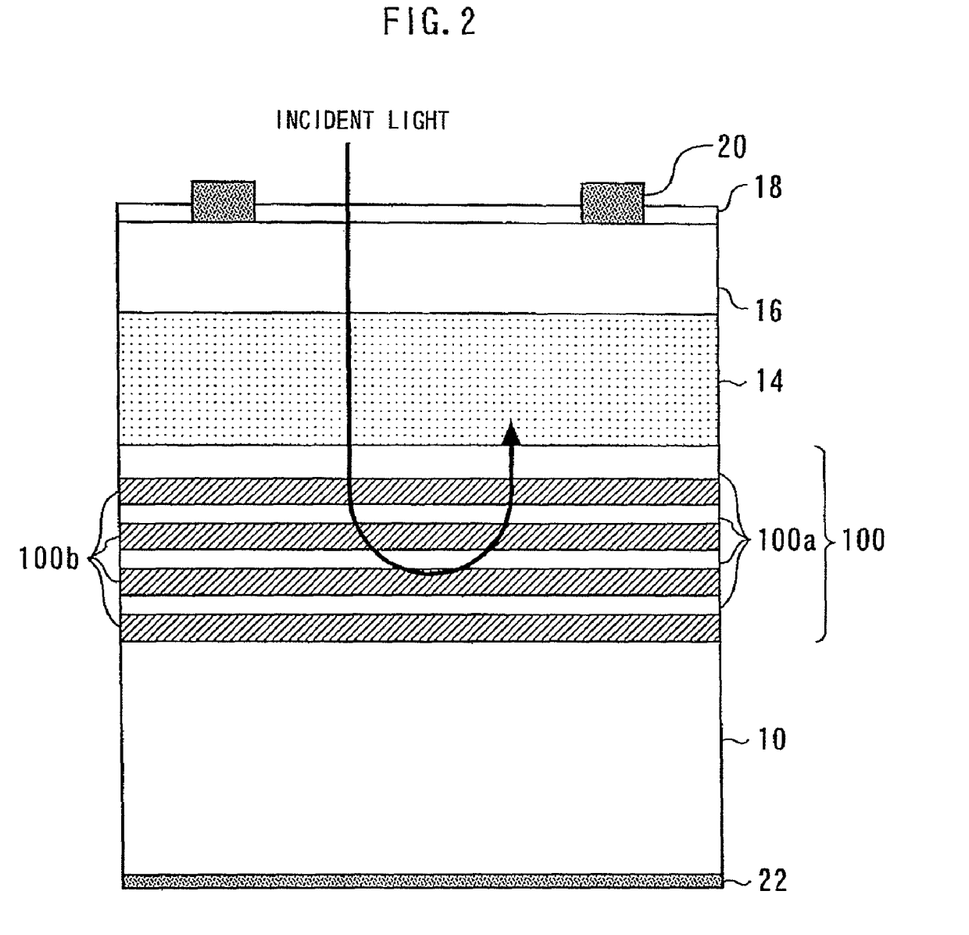
FIG. 2 is a sectional view showing a semiconductor light receiving element according to the first comparative example.

The effect of the semiconductor light receiving element according to the present embodiment will be described comparing with comparative examples. FIG. 2 is a sectional view showing a semiconductor light receiving element according to the first comparative example. The n-type DBR layer 100 is formed by alternately laminating 15 pairs of n-type InP layers 100a and n-type InGaAsP layers 100b having different refractive indices. Both the n-type InP layer 100a and the n-type InGaAsP layer 100b have large band-gaps, and do not absorb the incident light. The band-gap wavelength of the n-type InGaAsP layer 100b is 1.2 μm. The second comparative example uses InGaAs layers in place of the n-type InGaAsP layers 100b. The optical layer thickness of each layer in the n-type DBR layer 100 is ¼ the wavelength of the incident light, 1.3 μm. Components other than the DBR layer are identical to those in the semiconductor light receiving element according to the present embodiment.

The sensitivities of the semiconductor light receiving element according to the present embodiment wherein the band-gap wavelength of the n-type InGaAsP layer 12b is made to be 1.35 μm, and the semiconductor light receiving elements according to the first and second comparative examples were measured, respectively. As a result, the sensitivity of the present embodiment was 0.9 A/W or higher, and was the highest. The reason is that high reflectance can be obtained because a large difference in refractive indices between the n-type InP layer 12a and the n-type InGaAsP layer 12b in the n-type DBR layer 12 can be sufficiently taken in the present embodiment, and the effect of optical absorption in the n-type DBR layer 12 is small. On the other hand, in the first comparative example, sufficient reflectance of the n-type DBR layer cannot be obtained with about 15 pairs of InGaAsP layers and InP layers. In the second comparative example, the optical absorption in the n-type DBR layer becomes large, and sufficient reflectance cannot be obtained.

Figure 3:
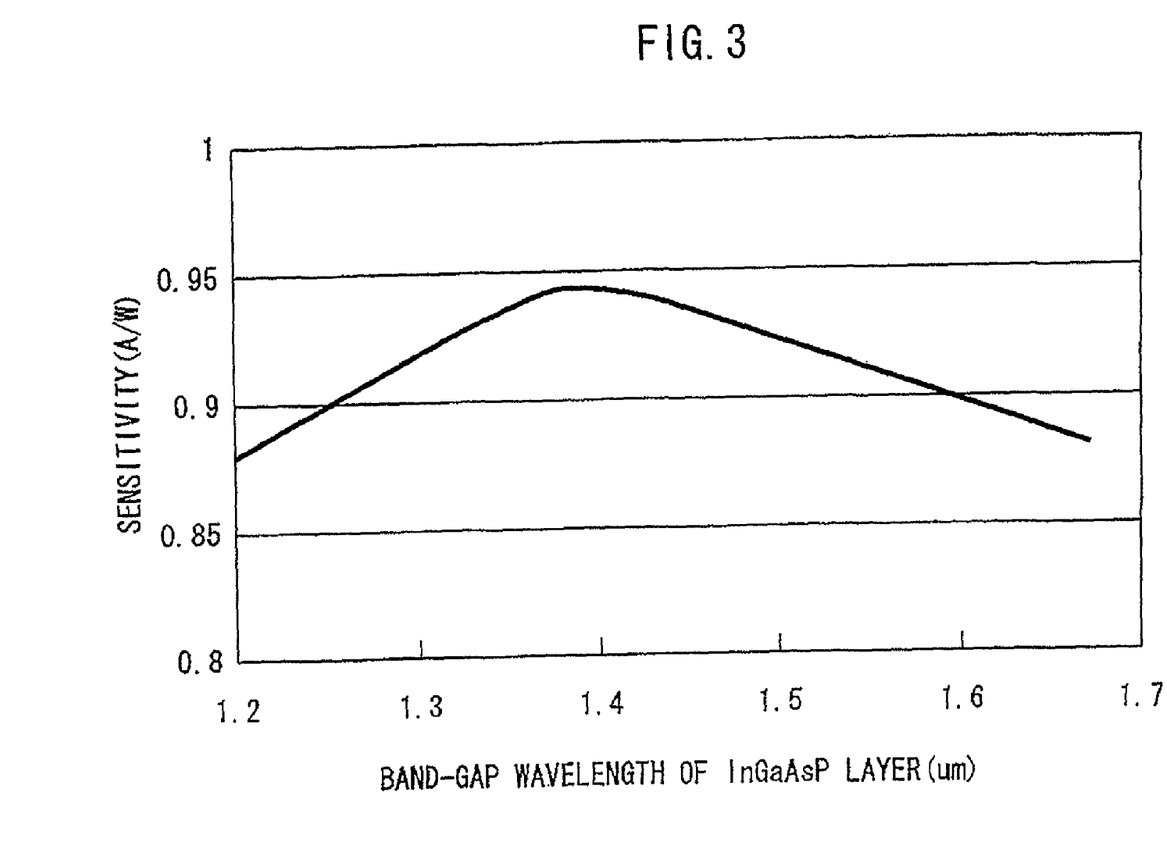
FIG. 3 is a graph showing a result of calculating the sensitivity of a semiconductor light receiving element according to the first embodiment by changing the band-gap wavelength of an InGaAsP layer.

FIG. 3 is a graph showing a result of calculating the sensitivity of a semiconductor light receiving element according to the first embodiment by changing the band-gap wavelength of an InGaAsP layer. The wavelength of the incident light was 1.3 μm, the thickness of the i-InGaAs optical absorption layer 14 was 1 μm, and the number of pairs in the n-type DBR layer 12 was 15. It is found that the sensitivity becomes maximal when the band-gap wavelength of the n-type InGaAsP layer 12b is between 1.30 μm and 1.55 μm, and the sensitivity is lowered when the band-gap wavelength is longer or shorter than this range.

It is also preferable that the n-type DBR layer 12 includes 20 or less pairs of an n-type InP layer 12a and an n-type InGaAsP layer 12b. Thereby, the thickness and the material composition of the n-type DBR layer 12 can be uniformly controlled on the wafer surface, reflectance as designed can be obtained, and the reproducibility is excellent. In addition, with the present embodiment, the reflectance of the n-type DBR layer 12 for the incident light in the vicinity of 1.3 μm band can be elevated even with 20 pairs or less.

In place of the n-type InP layer 12a, an InGaAsP layer, an AlGaInAs layer, a GaInNAs layer, or the like, whose band-gap wavelength is smaller than the wavelength of the incident light, may also be used. In place of the n-type InGaAsP layer 12b, an AlGaInAs layer, whose band-gap wavelength is larger than the wavelength of the incident light, may also be used.

Second Embodiment

In a second embodiment, the band-gap wavelengths of a plurality of n-type InGaAsP layers 12b in the n-type DBR layer 12 become smaller closer to the i-InGaAs optical absorption layer 14 and become larger further from the i-InGaAs optical absorption layer 14. The average band-gap wavelength of the plurality of n-type InGaAsP layers 12b is 1.35 µm to 1.55 µm. The sum of the optical layer thickness of one layer of n-type InP layers 12a and the optical layer thickness of one layer of n-type InGaAsP layers 12b is approximately half the wavelength λ of the incident light, that is, approximately half the reflectance peak wavelength. Other components are identical to the components of the first embodiment. Also by this configuration, the same effect as in the first embodiment can be obtained.

Third Embodiment

Figure 4:
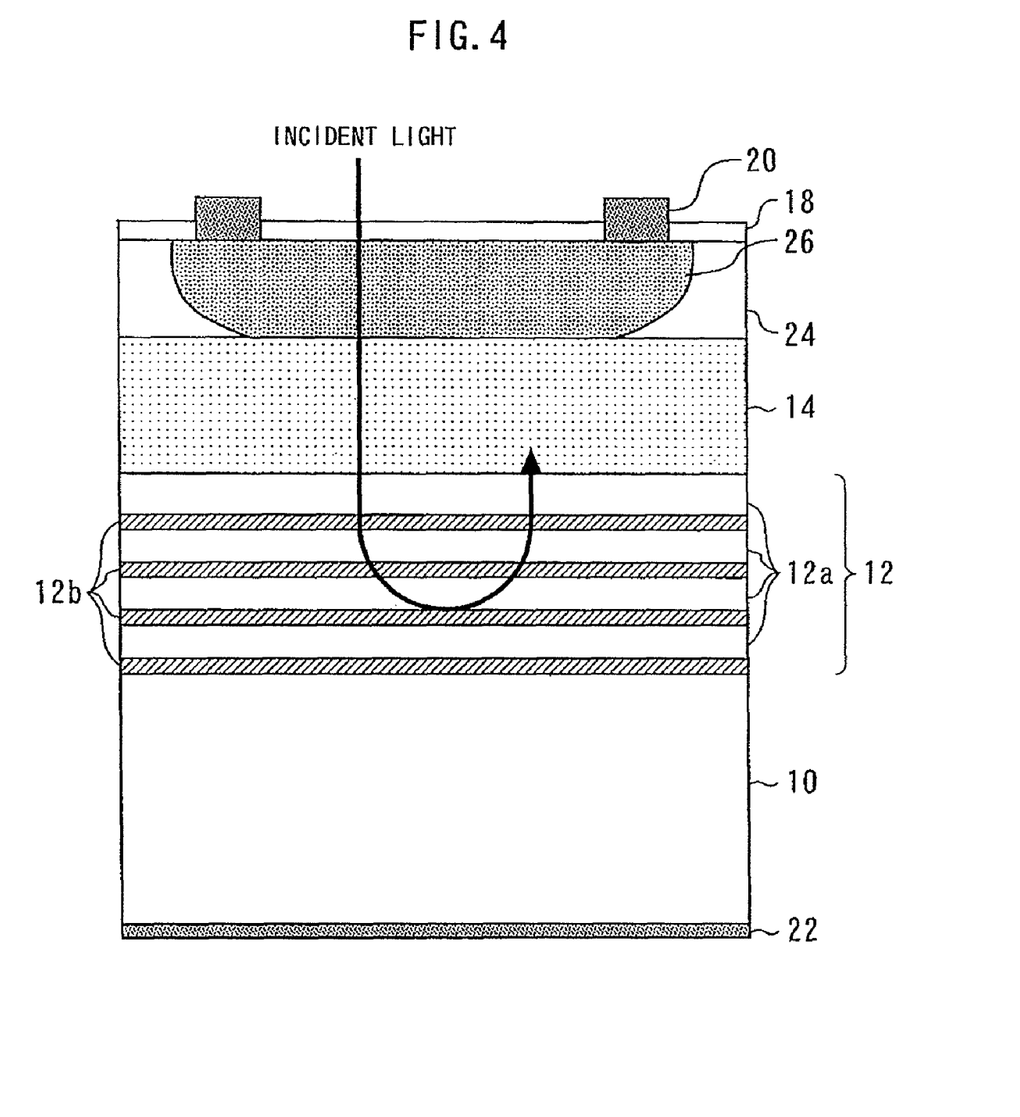
FIG. 4 is a sectional view showing a semiconductor light receiving element according to a third embodiment.

FIG. 4 is a sectional view showing a semiconductor light receiving element according to a third embodiment. The semiconductor light receiving element is a planar-type pin-photodiode wherein the p-type region is formed by selective diffusion.

An n-type InP layer 24 having a low carrier concentration is formed on an i-InGaAs optical absorption layer 14 and a p-type InP layer 26 (semiconductor layer of the second conductivity type) is formed in a part of the n-type InP layer 24 by selective diffusion or the like. The configuration of the n-type DBR layer 12 is the same as in the first embodiment or the second embodiment. Thereby, the same effect as in the first embodiment can be obtained.

Fourth Embodiment

Figure 5:
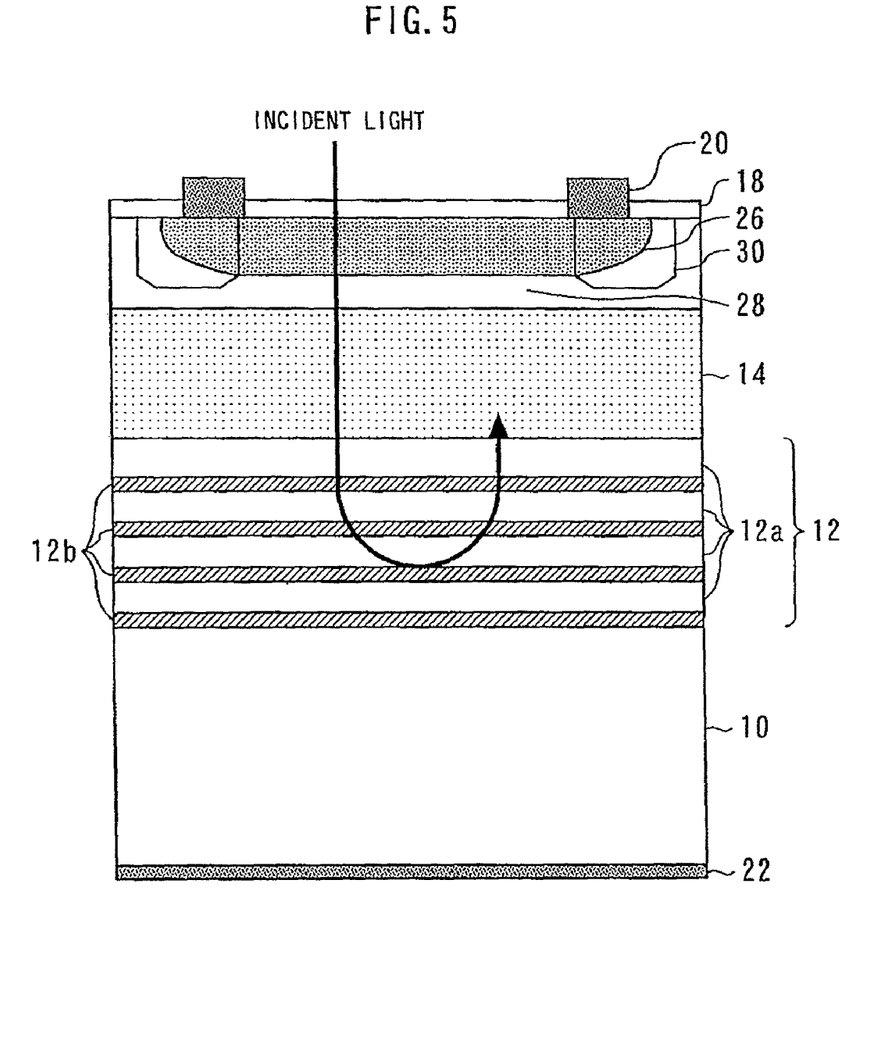
FIG. 5 is a sectional view showing a semiconductor light receiving element according to a fourth embodiment.

FIG. 5 is a sectional view showing a semiconductor light receiving element according to a fourth embodiment. The semiconductor light receiving element is a planar-type InP avalanche photodiode.

An n-type InP multiplication layer 28 (carrier multiplication layer) is formed on an i-InGaAs optical absorption layer 14, and a p-type InP layer 26 (semiconductor layer of the second conductivity type) is formed in a part of the n-type InP multiplication layer 28 by selective diffusion or the like. A guard ring 30 is formed in the periphery of the p-type InP layer 26 by the implantation of Be ions. The n-type InP multiplication layer 28 performs the avalanche multiplication of photocarriers generated in the i-InGaAs optical absorption layer 14. The configuration of the n-type DBR layer 12 is the same as in the first embodiment or the second embodiment. Thereby, the same effect as in the first embodiment can be obtained.

Fifth Embodiment

Figure 6:
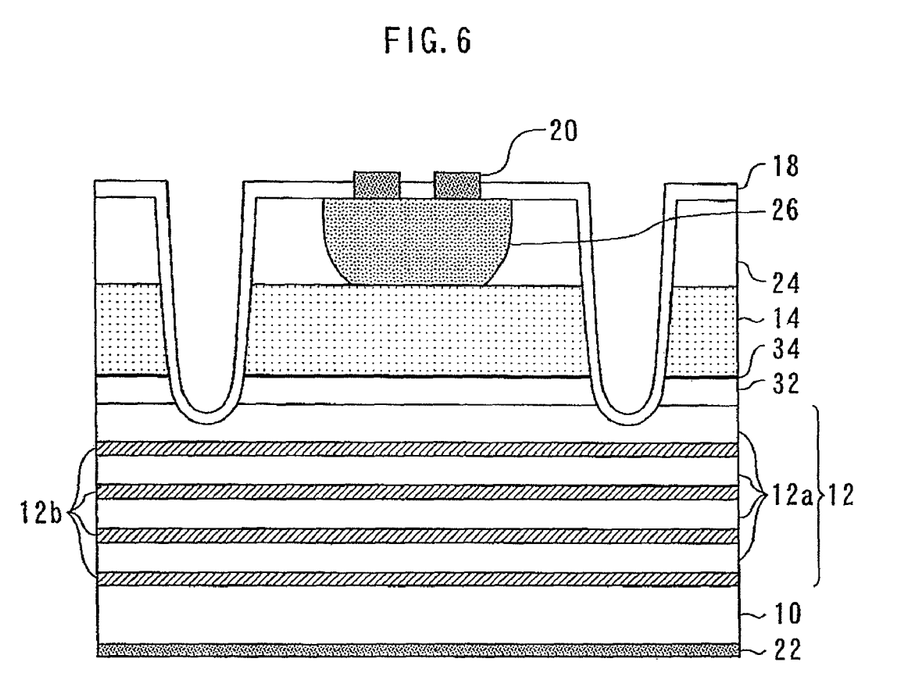
FIG. 6 is a sectional view showing a semiconductor light receiving element according to a fifth embodiment.

FIG. 6 is a sectional view showing a semiconductor light receiving element according to a fifth embodiment. The semiconductor light receiving element is a planar-type AlInAs avalanche photodiode.

An n-type AlInAs multiplication layer 32 (carrier multiplication layer) and a field relaxation layer 34 are formed between the n-type DBR layer 12 and the i-InGaAs optical absorption layer 14. The n-type AlInAs multiplication layer 32 performs the avalanche multiplication of photocarriers generated in the i-InGaAs optical absorption layer 14. Other components are identical to the components of the third embodiment.

Since the n-type InP layer 12a having a low heat resistance is present in the vicinity of the n-type AlInAs multiplication layer 32 to become a heat generating source, highly efficient heat dissipation can be performed. If an AlInAs layer same as the n-type AlInAs multiplication layer 32 is used in place of the n-type InP layer 12a as a layer having a low refractive index for the n-type DBR layer 12, crystals can be stably grown because of the same material.

Sixth Embodiment

Figure 7:
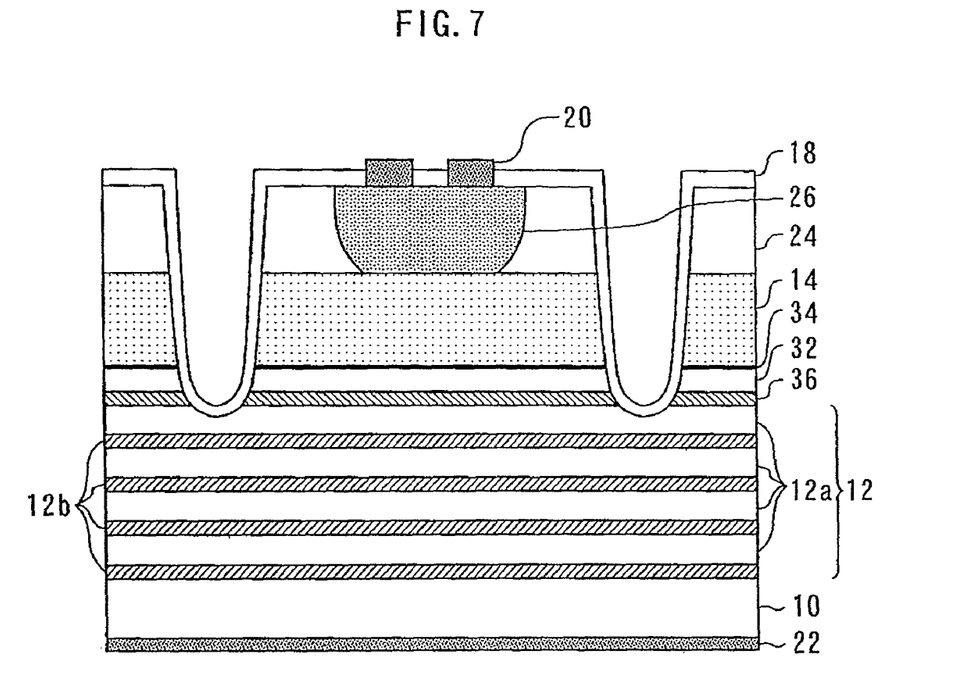
FIG. 7 is a sectional view showing a semiconductor light receiving element according to a sixth embodiment.

FIG. 7 is a sectional view showing a semiconductor light receiving element according to a sixth embodiment. The semiconductor light receiving element is a planar-type AlInAs avalanche photodiode as in the fifth embodiment.

An n-type AlInAs layer 36 having a high carrier concentration is inserted between the n-type InP layer 12a in the n-type DBR layer 12 and the n-type AlInAs multiplication layer 32. Other constitutions are identical to the constitutions of the fifth embodiment. Thereby, since the electric field of the n-type AlInAs multiplication layer 32 is not applied to the n-type InP layer 12a, the multiplication of the holes in the n-type InP layer 12a is suppressed, and low-noise avalanche photodiode can be realized.

Seventh Embodiment

Figure 8:
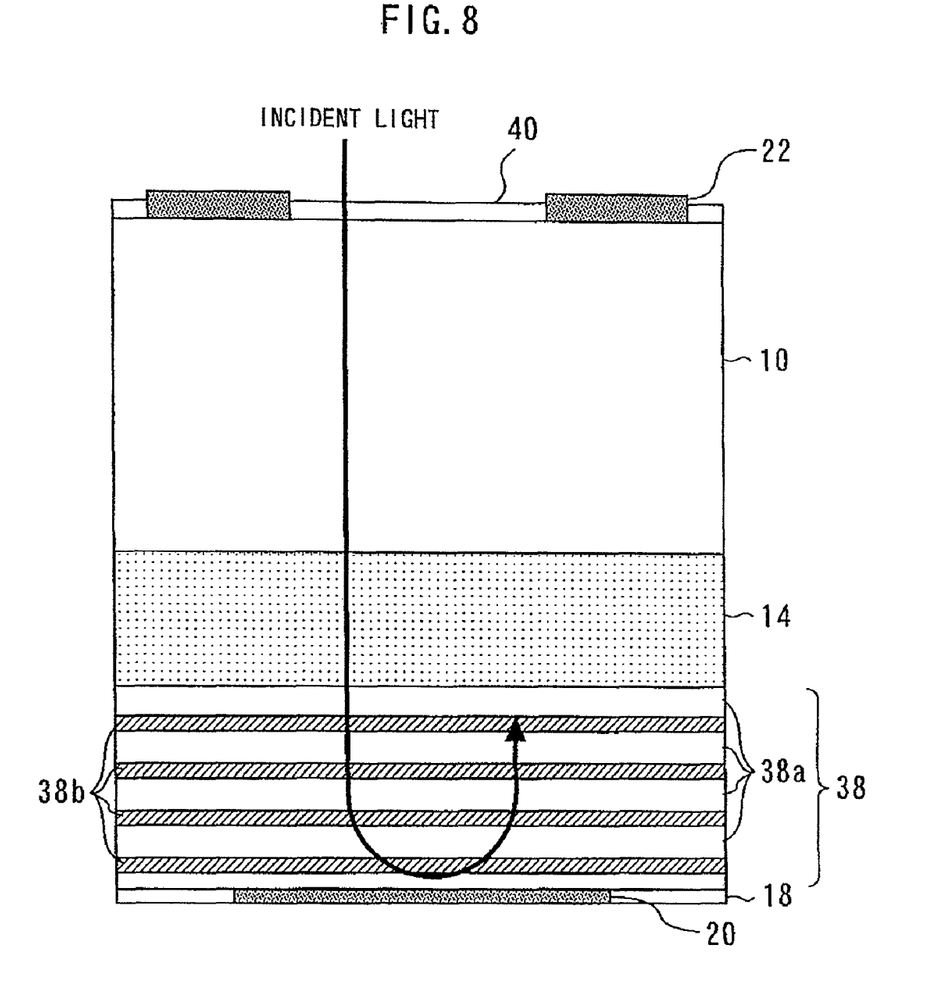
FIG. 8 is a sectional view showing a semiconductor light receiving element according to a seventh embodiment.

FIG. 8 is a sectional view showing a semiconductor light receiving element according to a seventh embodiment. The semiconductor light receiving element is a backside incident resonance photodiode wherein light is incident from the substrate side.

An i-InGaAs optical absorption layer 14 having a low carrier concentration (optical absorption layer) and a p-type DBR layer 38 (DBR layer of the second conductivity type) are sequentially formed on an n-type InP substrate 10 (semiconductor substrate of the first conductivity type). An insulating film 18 composed of SiN or the like, which is used as both a reflection preventing film and a surface protecting film, and an anode (p-type electrode) 20 are formed on the p-type DBR layer 38. A cathode (n-type electrode) 22 and a reflection preventing film 40 are formed on the backside of the n-type InP substrate 10. The incident light enters from the backside of the n-type InP substrate 10.

The p-type DER layer 38 is formed by alternately laminating 15 pairs of p-type InP layers 38a (second semiconductor layers) having a low refractive index and p-type InGaAsP layers 38b (first semiconductor layers) having a high refractive index. The band-gap wavelength of the p-type InP layer 38a is smaller than the wavelength λ of the incident light. On the other hand, the band-gap wavelength of the p-type InGaAsP layer 38b is larger than the wavelength λ of the incident light.

The wavelength λ of the incident light is in the vicinity of the 1.3 µm band. The reflectance peak wavelength of the p-type DBR layer 38 is 1.20 µm to 1.35 µm. The band-gap wavelength of the p-type InGaAsP layer 38b is 1.30 µm to 1.55 µm.

The thickness of the i-InGaAs optical absorption layer 14 is 1 µm. The optical layer thickness of one of the p-type InP layers 38a and the optical layer thickness of one of the p-type InGaAsP layers 38b is about ¼ the wavelength λ of the incident light, respectively. However, the present invention is not limited to the above values, but the sum of the optical layer thickness of one of the p-type InP layers 38a and the optical layer thickness of one of the p-type InGaAsP layers 38b can be about half of wavelength λ of the incident light, that is, about half of the wavelength at the reflectance peak. Thereby, the p-type DBR layer 38 operates as a reflection layer for the incident light at high efficiency.

Using the above-described configuration, the effect same as in the first embodiment can be obtained. Furthermore, since the absorption coefficient of the p-type InGaAsP layers 38b having a high refractive index is small, the loss of the incident light is reduced. In addition, since the anode 20 operates as a high reflectance mirror, the light that has passed through the p-type DBR layer 38 is further reflected and can contribute to absorption, and a higher sensitivity can be anticipated.

Eighth Embodiment

In an eighth embodiment, the band-gap wavelength of a plurality of p-type InGaAsP layers 38b in the p-type DBR layer 38 becomes smaller as approaching the i-InGaAs optical absorption layer 14 and becomes larger as separating from the i-InGaAs optical absorption layer 14. The average band-gap wavelength of a plurality of the p-type InGaAsP layers 38b is 1.35 μm to 1.55 μm. Other constitutions are identical to the constitutions of the seventh embodiment. Also by these constitutions, the same effect as in the seventh embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-220018, filed on Sep. 25, 2009 including specification, claims, drawings and summary, on which the Convention priority of the present application is based, are incorporated herein by reference in its entirety.

What is claimed is:

1. A semiconductor light detecting element comprising:
a semiconductor substrate; and
a distributed Bragg reflector of a first conductivity type, an optical absorption layer, and a semiconductor layer of a second conductivity type, which are sequentially laminated on the semiconductor substrate, wherein
the distributed Bragg reflector includes first semiconductor layers and second semiconductor layers which are alternately laminated,
each first semiconductor layer has a band-gap wavelength which is longer than wavelength of detected light which is incident on and detected by the light detecting element,
each second semiconductor layer has a band-gap wavelength which is shorter than the wavelength of the detected light,
reflectance peak wavelength of the distributed Bragg reflector is in a range from 1.20 μm to 1.35 μm,
band-gap wavelengths of the first semiconductor layers in the distributed Bragg reflector become shorter closer to the optical absorption layer and become longer further from the optical absorption layer, and
average band-gap wavelength of the first semiconductor layers is in a range from 1.35 μm to 1.55 μm.

2. The semiconductor light detecting element according to claim 1 wherein the sum of an optical layer thickness of one of the first semiconductor layers and one of the second semiconductor layers is approximately one-half of the wavelength of the detected light.

3. The semiconductor light detecting element according to claim 1 wherein the distributed Bragg reflector includes no more than 20 pairs of the first semiconductor layer and the second semiconductor layer.

4. The semiconductor light detecting element according to claim 1 including a carrier multiplication layer located between the optical absorption layer and the semiconductor layer of the second conductivity type, the carrier multiplication layer providing avalanche multiplication of photocarriers generated in the optical absorption layer.

5. The semiconductor light detecting element according to claim 1 including a carrier multiplication layer located between the distributed Bragg reflector and the optical absorption layer, the carrier multiplication layer providing avalanche multiplication of photocarriers generated in the optical absorption layer.

6. A semiconductor light detecting element comprising:
a semiconductor substrate of a first conductivity type; and
an optical absorption layer, and a distributed Bragg reflector of a second conductivity type which are sequentially laminated on the semiconductor substrate, wherein
detected light incident on and detected by the light detecting element enters from a backside of the semiconductor substrate,
the distributed Bragg reflector includes first semiconductor layers and second semiconductor layers which are alternately laminated,
each first semiconductor layer has a band-gap wavelength which is longer than wavelength of the detected light,
each second semiconductor layer has a band-gap wavelength which is shorter than the wavelength of the detected light,
reflectance peak wavelength of the distributed Bragg reflector is in a range from 1.20 μm to 1.35 μm,
band-gap wavelengths of the first semiconductor layers in the distributed Bragg reflector become shorter closer to the optical absorption layer and become longer further from the optical absorption layer, and
average band-gap wavelength of the first semiconductor layers is in a range from 1.35 μm to 1.55 μm.

* * * * *